United States Patent [19]

O'Brien

[11] 4,066,473
[45] Jan. 3, 1978

[54] METHOD OF FABRICATING HIGH-GAIN TRANSISTORS

[75] Inventor: David O'Brien, Mountain View, Calif.

[73] Assignee: Fairchild Camera and Instrument Corporation, Mountain View, Calif.

[21] Appl. No.: 705,382

[22] Filed: July 15, 1976

[51] Int. Cl.² .......................................... H01L 21/26
[52] U.S. Cl. .................................. 148/1.5; 148/175; 148/187
[58] Field of Search ..................... 148/1.5, 175, 187

[56] References Cited

U.S. PATENT DOCUMENTS

| | | | |
|---|---|---|---|
| 3,755,001 | 8/1973 | Kodi et al. | 148/1.5 |
| 3,808,058 | 4/1974 | Henning | 148/1.5 |
| 3,933,540 | 1/1976 | Kondo et al. | 148/187 |
| 3,962,717 | 6/1976 | O'Brien | 148/175 |
| 3,996,077 | 12/1976 | Verkuijlen | 148/187 |

Primary Examiner—G. Ozaki
Attorney, Agent, or Firm—Alan H. MacPherson; Henry K. Woodward; Norman E. Reitz

[57] ABSTRACT

A method of fabricating bipolar transistors with increased gain. A base region is formed adjacent the collector (or emitter) region of the transistor, and a portion of the base region is then removed by etching. The emitter (or collector) is then formed by diffusing dopant into the base region where the portion has been removed, with the base region separating the emitter and collector having reduced thickness due to the etching. Advantageously, the base region may be formed with a more heavily-doped region overlying a less heavily-doped region, with a part of the more heavily-doped region removed by etching, thereby providing a highly conductive path to the lower conductivity base region separating the emitter and collector regions. The process steps are compatible with conventional integrated-circuit fabrication processes.

12 Claims, 10 Drawing Figures

METHOD OF FABRICATING HIGH-GAIN TRANSISTORS

BACKGROUND OF THE INVENTION

1. Field of the Invention

This invention relates generally to semiconductor technology and more particularly to semiconductor devices and methods of manufacturing same.

2. Prior Art

Many electrical circuits which are embodied in integrated semiconductor form employ merged transistor structures wherein regions of the semiconductor body provide multiple functions. Typical is the integrated injection logic cell, wherein an injector transistor and a complementary gate transistor have common regions, i.e., the collector of the lateral or injector transistor is interconnected with the base of the gate transistor via a common diffused region, and the base of the injector transistor is similarly interconnected with the emitter of the gate transistor. Embodiments of such structures are found in copending U.S. application Ser. No. 518,445, filed Oct. 29, 1974, now U.S. Pat. 3,962,717 for "COMBINED METHOD FOR FABRICATING OXIDE-ISOLATED VERTICAL BIPOLAR TRANSISTORS AND COMPLEMENTARY OXIDE-ISOLATED LATERAL BIPOLAR TRANSISTORS AND THE RESULTING STRUCTURES," now U.S. Pat. No. 3,962,717 issued June 8, 1976, assigned to the present assignee.

As disclosed therein, a process for fabricating oxide-isolated vertical bipolar transistors, complementary oxide-isolated lateral bipolar transistors and composite bipolar transistors merging both vertical and lateral bipolar transistors comprises the steps of growing a doped epitaxial layer on a semiconductor substrate, the epitaxial layer having a conductivity type opposite to the cnductivity type of the substrate, forming a groove in the epitaxial layer to surround and define a device region, selectively applying an impurity to the groove to selectively form a guard ring, the impurity having a conductivity type opposite to the conductivity type of the epitaxial layer, forming oxide-isolation regions in the grooves and forming at least one semiconductor device in the device region. In a preferred embodiment in which vertical bipolar transistors and complementary lateral bipolar transistors are merged into an injection logic gate, the step of forming a groove is accomplished by the step of applying a first insulation material in a selected pattern over the epitaxial layer to define oxide-isolation regions and device regions, and by etching those areas in which oxide-isolation regions will be formed and the step of selectively applying an impurity to the grooves is accomplished by an ion implantation technique which allows impurities to be introduced into the bottom portion of the groove but not into the vertical side wall. This provides electrical isolation between the buried layer regions of adjacent devices.

The resulting oxide-isolated structure comprises the semiconductor substrate, an epitaxial layer overlying the substrate and having a conductivity type opposite to that of the substrate, an oxide-isolation region which surrounds and defines a device region, the device region having a guard ring selectively formed at the interface of the oxide-isolation region and the device region, and at least one semiconductor device formed in the device region.

In such semiconductor structures, it is often desirable and advantageous to provide a low doped base region between the collector and the overlying emitter regions in order to achieve a higher gain transistor characteristic and for high speed operation. This area is commonly referred to as the intrinsic or active base region. Further, to improve the current capability of the transistor or to enhance the overall circuit performance by increasing the fan out capability, a low base resistance is desired in the semiconductor base region not juxtaposed between the collector and base transistor regions. This region is commonly referred to as the extrinsic base region. Heretofore, these characteristics have been achieved through the use of selective masking, by driving a heavily-doped emitter region through a heavily-doped base region to interface with a lower doped underlying base region, and by the use of ion-implantation in defining the emitter region. Each of these methods has limitations in adding to process complexity, diffusion control, and/or damage to the semiconductor lattice when applying heavy ion implantation.

SUMMARY OF THE INVENTION

The present invention achieves the desired characteristics of an intrinsic base region intermediate the collector and emitter regions of a bipolar transistor with more heavily doped extrinsic base material surrounding the intrinsic base region to achieve high gain and permit large fan-out. Advantageously, the process of the invention can be easily combined with the process described in copending application Ser. No. 518,445, supra, to provide improved oxide-isolated structures.

Briefly, in one embodiment a lightly-doped base region is formed in a semiconductor body by ion implantation and thereafter a more heavily-doped base region is formed by the diffusion of impurities into the body above the ion-implanted region, thereby defining a base region of heavily-doped material overlying lightly-doped material. A diffusion window is provided over a selected area of the heavily-doped region through a conventional oxide masking techniques, and a suitable etchant is applied to remove a portion of, or all the underlying heavily-doped region while leaving the lightly-doped base region intact. Next, a suitable heat treatment in an inert ambient may be used to modify the impurity distribution and increase the junction depth of the heavily-doped region. This improves the conductivity of the region and enhances the geometric aspects of certain devices. Thereafter, the emitter dopant is diffused through the diffusion window whereby an emitter region is defined which interfaces in close proximity to, or in direct contact with the lightly-doped base region. Thus, the base region separating the emitter and collector regions of the resulting bipolar structure had reduced thickness and a relatively low doping concentration, thereby increasing the gain of the bipolar transistor. Additionally, the remaining base region is more heavily doped, thereby reducing the resistance to injected currents or conductive interconnections with other components. The resulting structure is particularly advantageous also for high-frequency operation and with circuits having large fan-out requirements. Moreover, th process is compatible with standard integrated-circuit fabrication without greatly increased process complexity.

Objectives and features of the invention will be more fully appreciated from the following detailed description and appendant claims when taken with the drawing.

DESCRIPTION OF THE ILLUSTRATIVE EMBODIMENT

FIGS. 1 – 10 are section views of a semiconductor wafer illustrating steps in the fabrication of an oxide-isolated, integrated injection logic device which utilizes the process in accordance with the present invention. The various techniques in semiconductor processing including diffusion, epitaxial growth, photoresist masking techniques, oxide-isolation, and the like, are now well known in the art and require no elaboration herein. Reference may be made to copending application Ser. No. 518,445, filed Oct. 29, 1974, for a description of the process steps in fabricating oxide-isolated integrated injection logic devices.

Figure 1:
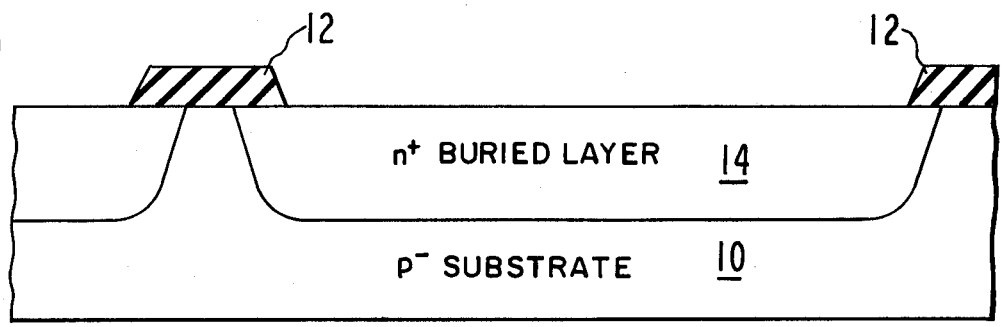
FIGS. 1 – 10 are section views of a semiconductor wafer illustrating steps in the fabrication of an oxide-isolated, integrated injection logic device utilizing the process in accordance with the present invention.

As shown in FIG. 1, initially a silicon substrate 10 of lightly-doped P type conductivity is masked on one surface by oxide 12 and a heavily-doped N type buried layer 14 is diffused into wafer 10. As will be described hereinbelow, the buried layer 14 will become part of the emitter region of an inverted vertical transistor in the integrated injection logic structure.

Figure 2:
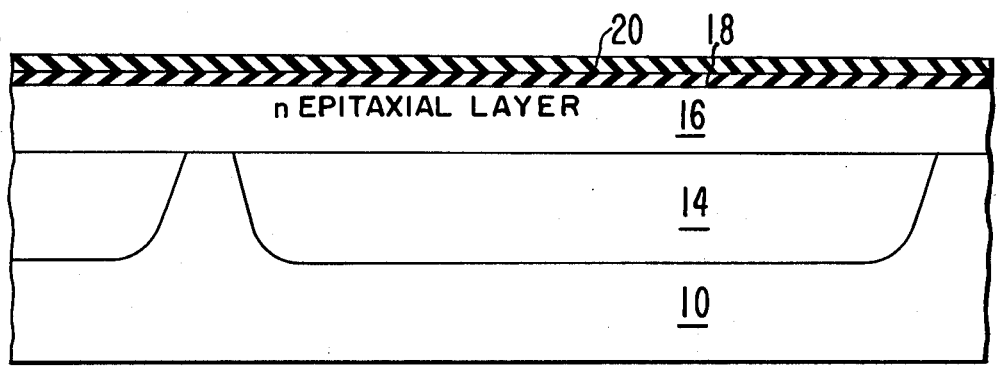

Referring to FIG. 2, an N type epitaxial layer 16 is grown on the surface of substrate 10 overlying the buried layer 14, a silicon nitride layer 18 is formed on the surface of the epitaxial layer, and a layer 20 of silicon oxide (Vapox) is formed on the surface of the nitride layer 18. Both layers are formed by conventional semiconductor processing techniques.

Figure 3:
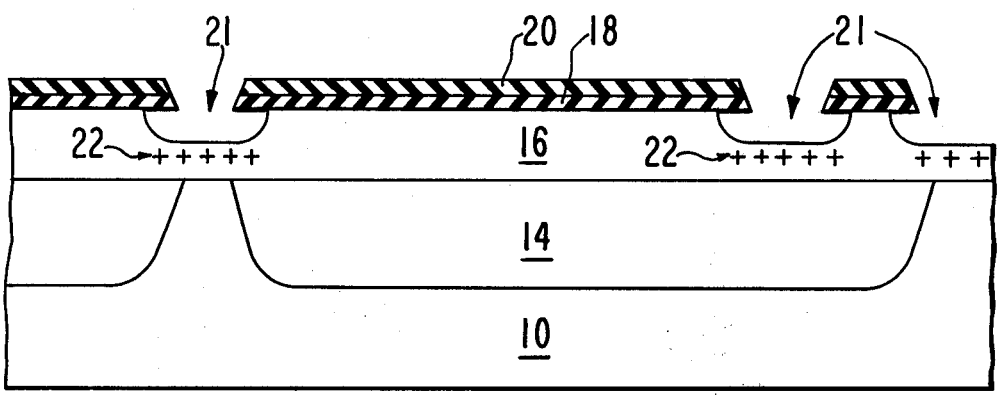
Figure 4:
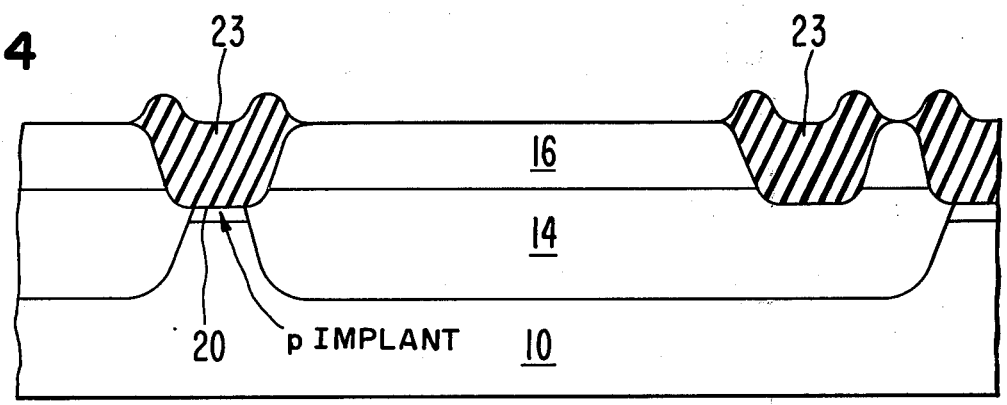

Thereafter, as shown in FIG. 3, windows 21 are formed in the layers of silicon oxide 20 and silicon nitride 18, and portions of the exposed epitaxial layer 16 are removed by suitable silicon etchant. A P type field implant 22 such as boron is then diffused through the windows 21 and into the remaining exposed epitaxial layer 16. The exposed doped epitaxial layer is subsequently oxidized with resulting oxide-isolation barrier regions 23 formed in the diffusion windows 21, and the silicon nitride layer 18 and the silicon oxide layer 20 are then removed from the surface of the epitaxial layer 16 as shown in FIG. 4. Due to the field implant, a P type doped region 24 underlies the oxide-isolation barrier 23, thereby electrically isolating adjacent buried layers in the substrate 10.

Figure 5:
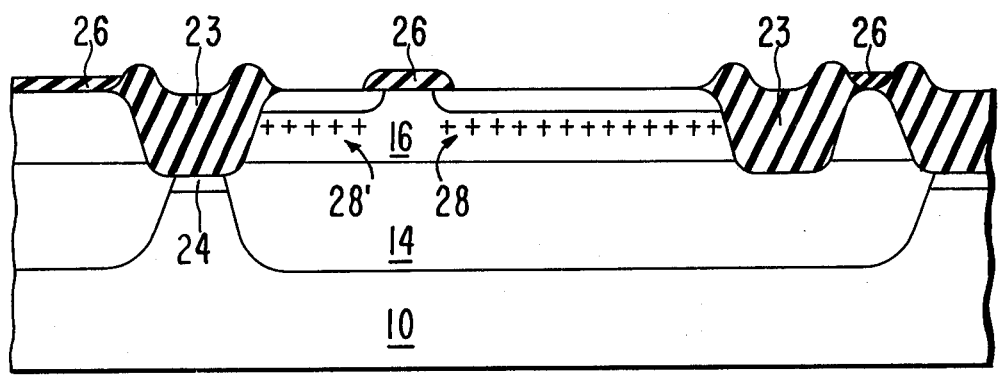
Figure 6:
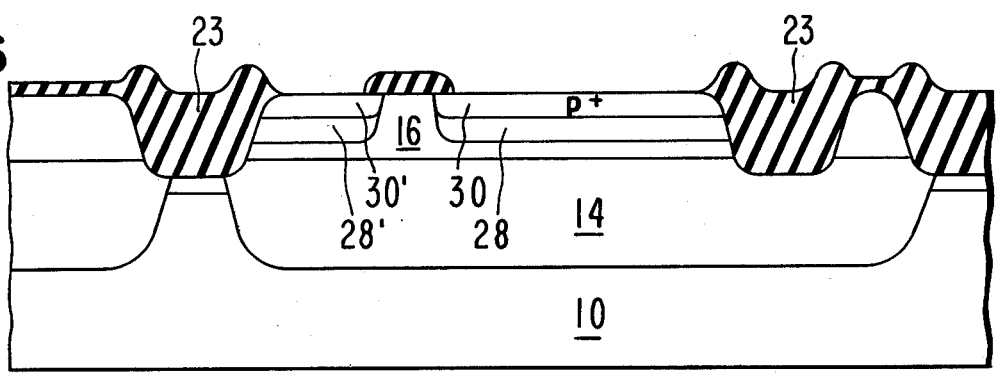

Referring to FIG. 5, diffusion windows are formed on the surface of epitaxial layer 16 by means of silicon oxide 26 (in cooperation with oxide barrier regions 23), and lightly-doped P− regions 28, 28′ are formed within epitaxial layer 16 by means of ion-implantation. Thereafter, more heavily-doped P + type regions 30, 30′ are deposited to a shallow depth through the diffusion windows which overlie the lightly-doped P− regions 28, 28′ within the epitaxial layer 16 as shown in FIG. 6. The P type regions 28 and 30 will cooperatively function as the base region of the inverted vertical NPN transistor being fabricated, and the P regions 28′ and 30′ will function as the emitter of a lateral PNP transistor of the injection logic cell.

Figure 7:
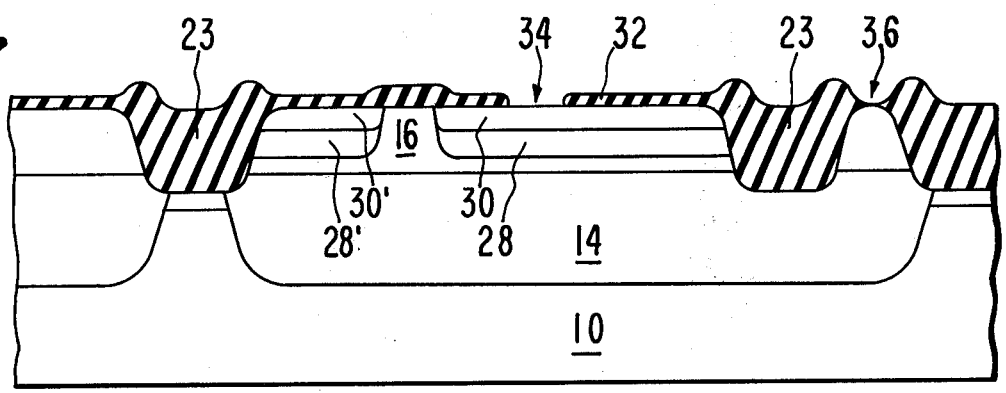
Figure 8:
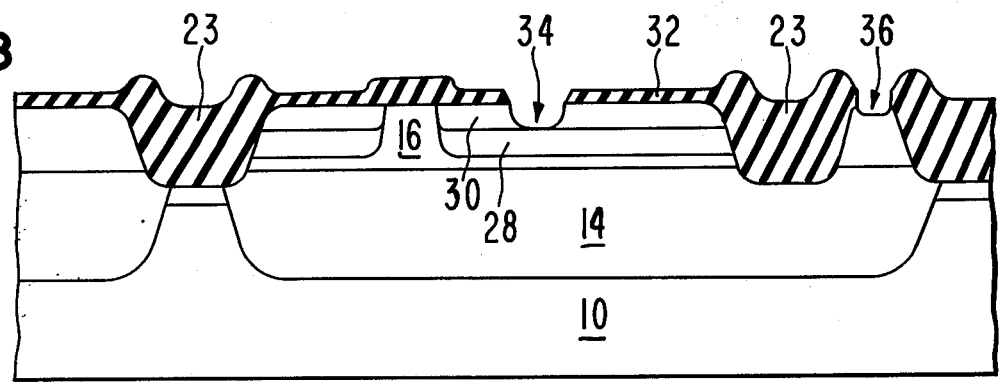

In FIG. 7, an additional oxide layer 32 is formed on the surface of the epitaxial layer 16 and a window 34 is formed through the oxide layer 32 overlying P+ region 30. An additional window 36 through oxide 32 exposes a portion of epitaxial layer 16 for the subsequent contact formation to layer 16. In accordance with the present invention, all or a portion of the exposed heavily-doped P+ is removed by etching as illustrated in FIG. 8. For purposes of illustration, all of the exposed region 30 underlying window 34 is shown removed, but it will be appreciated that, in certain structures, a portion of the heavily-doped P+ layer may remain.

Figure 9:
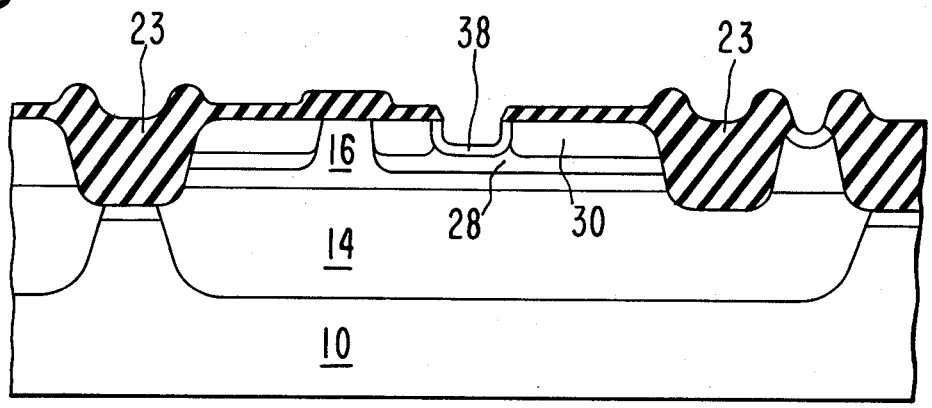

Generally, for purposes of reproducibility, it would be advantageous to minimize the silicon etch depth by forming the heavily-doped P+ region close to the surface. This can be readily done by such established methods as chemical deposition or ion implantation. The formation of the oxide layer above this silicon region by low temperature vapox deposition as opposed to thermal oxidation preserves the P + region in close proximity to the surface. Subsequent to etching the P+ silicon in region 34, a suitable heat treatment can be used to redistribute the P+impurities in region 30 and increase the junction depth as illustrated in FIG. 9. This improves the electrical conductivity of the region and enhances the geometrical aspects of certain devices, for example the lateral pnp formed by regions 30′, 28′, 30, 28 and 16.

Figure 10:
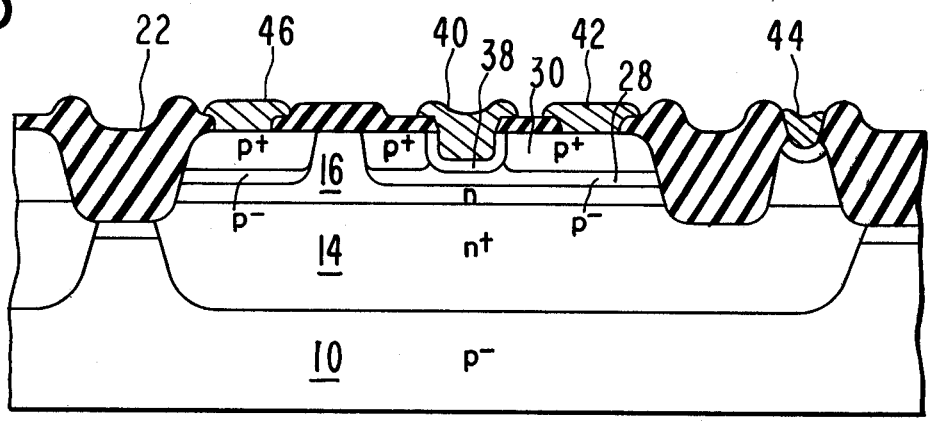

Subsequently, as shown in FIG. 10, an N type dopant is diffused through the window 34 in oxide layer 32 to form an N+ region 38 which functions as the collector region of the inverted lateral bipolar transistor. Importantly, it will be noted that the collector region 38 is separated from the underlying emitter region comprising the epitaxial layer 16 and buried layer 14 by the lightly-doped P type region 28. Thus, the vertical bipolar transistor is provided with a higher gain due to the lightly-doped base region, yet the remaining base region is of higher conductivity due to the remaining highly-doped P+region 30 which was not removed by etching. Thus, a high conductivity current path is provided for the base of the vertical transistor and the collector of the lateral bipolar transistor formed in the epitaxial layer 16 adjacent the vertical transistor. It will be appreciated that a large fan-out from the vertical transistor is accommodated by the high conductivity current path provided by the remaining highly-doped layer 30, while the transistor is provided with a high gain due to the lightly-doped base region lying between the emitter and collector. Also, the lateral pnp formed by regions 30′, 28′, 30, 28 and 16 has improved gain due to the increased emitter area and emitter efficiency provided by the deep P+ region 30′.

As shown in FIG. 10, the device is completed by providing metallization for the collector contact 40, base contact 42, and emitter contact 44 of the vertical bipolar transistor; and a contact 46 is provided to the emitter of the lateral PNP transistor. The lateral PNP transistor comprises regions 30′, 16, and 28; and the NPN vertical transistor comprises regions 36, 28, and 16.

As seen from the above illustrative embodiment, by defining a base region comprising a lower doped portion with a higher doped overlying portion and forming a collector region in the base region, a high gain bipolar transistor is provided. Since the low doped region is formed by ion implantation accurate control of the gain is accomplished. Further, the highly-doped base region adjacent the emitter and collector regions provides a high conductance path to the transistor. Moreover, the process is compatible with conventional semiconductor processing and does note require any additional masking steps.

While the invention has been described with reference to an illustrative embodiment, the description is solely for purposes of illustration and is not to be construed as limiting the scope of the invention. The process may be employed in fabricating other integrated circuits and discrete transistors where increased transistor gain is desired. Thus, various modifications, changes and applications may be made by those skilled in the art without departing from the true scope and spirit of the invention as defined by the appended claims.

I claim:

1. The method of fabricating a bipolar transistor with improved gain in a semiconductor body comprising the steps of:
   forming a first region of one conductivity type in said semiconductor body,
   forming a second region of opposite conductivity type overlying said first region and extending to a surface of said semiconductor body;
   removing part of said second region; and
   diffusing a dopant of said one conductivity type into said second region where said part has been removed, thereby converting the net conductivity of a portion of said second region to said one conductivity type,
   said first region of one conductivity type comprising the transistor collector, said second region of opposite conductivity type comprising the transistor base, and said portion of said second region having a net conductivity of said one conductivity type comprising the transistor emitter.

2. The method of forming a transistor as defined by claim 1 wherein said one conductivity type is N type and said opposite conductivity type is P type.

3. The method of forming a transistor as defined by claim 1 wherein said second region includes a first surface-oriented portion of doped semiconductor material and a second portion of doped semiconductor material with said second portion having a dopant concentration lower than said first portion, said second portion lying between said first portion and said first region.

4. The method of forming a transistor as defined by claim 1 wherein said first region comprises a buried layer in a semiconductor wafer and an overlying epitaxial layer on said wafer.

5. The method of forming a transistor as defined by claim 4 wherein said second region comprises a diffused surface-oriented portion and an ion-implanted second portion.

6. The method of forming a transistor as defined by claim 5 wherein said part of said first region is removed by chemical etching.

7. The method of forming a bipolar transistor in a semiconductor body comprising the steps of:
   forming a first region of one conductivity type in said semiconductor body, said first region including a buried layer in said semiconductor body and an epitaxial layer overlying said buried layer;
   forming a second region of opposite type conductivity over-lying said first region and extending to a surface of said semiconductor body, said second region including a first surface-oriented portion of doped semiconductor material and a second portion of doped semiconductor material of lower dopant concentration than said first portion, said second portion lying between said first portion and said first region;
   removing at least part of said first portion of said second region; and
   diffusing a dopant of said one conductivity type into said second region where said part has been removed, thereby converting the net conductivity of some of said second region to said one conductivity type.

8. The method of forming a transistor as defined by claim 7 and further including after removing at least part of said second portion the step of heating said semiconductor body to modify the impurity distribution of said base region.

9. In the fabrication of bipolar transistors having emitter and collector regions of one conductivity type separated by a base region of opposite conductivity type, the method of increasing transistor gain by reducing base region conductivity and thickness, comprising the steps of forming a surface-oriented base region of said opposite conductivity type in said collector region of a semiconductor body, and removing a portion of said base region by etching, thereby reducing the thickness of said base region.

10. The method defined by claim 9 wherein said base region includes a first surface-oriented portion of doped semiconductor material and a second portion of doped semiconductor material lying between said first portion and said collector region, said second portion having a lower dopant concentration than said first portion.

11. The method as defined by claim 10 wherein said second region comprises a diffused surface-oriented portion and an ion-implanted second portion lying between said first portion and said collector region.

12. The method as defined by claim 11 wherein said collector region comprises a buried layer in a semiconductor wafer and an overlying epitaxial layer on said wafer.

* * * * *